(12) United States Patent
Popovich et al.

(10) Patent No.: US 7,595,679 B1
(45) Date of Patent: Sep. 29, 2009

(54) METHOD AND APPARATUS TO REDUCE NOISE FLUCTUATION IN ON-CHIP POWER DISTRIBUTION NETWORKS

(75) Inventors: Mikhail Popovich, Rochester, NY (US); Eby G. Friedman, Rochester, NY (US); Radu M. Secareanu, Phoenix, AZ (US); Olin L. Hartin, Phoenix, AZ (US)

(73) Assignee: University of Rochester, Rochester, NY (US)

( * ) Notice: Subject to any disclaimer, the term of this patent is extended or adjusted under 35 U.S.C. 154(b) by 355 days.

(21) Appl. No.: 11/402,252

(22) Filed: Apr. 12, 2006

Related U.S. Application Data

(60) Provisional application No. 60/670,253, filed on Apr. 12, 2005.

(51) Int. Cl.
*H03K 17/16* (2006.01)
(52) U.S. Cl. .................. 327/384; 327/382; 326/26; 326/33
(58) Field of Classification Search ......... 327/551–559, 327/384–385, 382; 326/33, 27
See application file for complete search history.

(56) References Cited

U.S. PATENT DOCUMENTS

| | | | | |
|---|---|---|---|---|
| 5,204,554 A | * | 4/1993 | Ohannes et al. | 326/33 |
| 5,319,260 A | * | 6/1994 | Wanlass | 326/26 |
| 5,604,453 A | * | 2/1997 | Pedersen | 327/112 |
| 6,121,827 A | * | 9/2000 | Khoini-Poorfard et al. | 327/565 |
| 6,208,190 B1 | * | 3/2001 | Lukoff | 327/307 |
| 6,319,793 B1 | * | 11/2001 | Bartlett et al. | 438/418 |
| 7,076,757 B2 | * | 7/2006 | Hirata | 716/10 |

OTHER PUBLICATIONS

M. Popovich, et al., "On-Chip Power Noise Reduction Techniques in High Performance SoC-Based Integrated Circuits" IEEE, 2005, pp. 309-312.

* cited by examiner

*Primary Examiner*—Dinh T. Le
(74) *Attorney, Agent, or Firm*—Blank Rome LLP

(57) ABSTRACT

A system-on-chip or other circuit has an on-chip noise-free ground which is added to divert ground noise from the sensitive nodes. An on-chip decoupling capacitor, tuned in resonance with the parasitic inductance of the interconnects, can be provided to add an additional low impedance ground path.

23 Claims, 3 Drawing Sheets

US 7,595,679 B1

METHOD AND APPARATUS TO REDUCE NOISE FLUCTUATION IN ON-CHIP POWER DISTRIBUTION NETWORKS

REFERENCE TO RELATED APPLICATION

The present application claims the benefit of U.S. Provisional Patent Application No. 60/670,253, filed Apr. 12, 2005, whose disclosure is hereby incorporated by reference in its entirety into the present disclosure.

STATEMENT OF GOVERNMENT INTEREST

The work leading to the present invention was supported in part by the National Science Foundation under Contract No. CCR-0304574 and by the Fulbright Program under Grant No. 87481764. The government has certain rights in the invention.

FIELD OF THE INVENTION

The present invention is directed to on-chip power distribution networks and more particularly to such networks incorporating an on-chip noise-free ground for diverting ground noise from the noise-sensitive circuit elements.

DESCRIPTION OF RELATED ART

Future generations of integrated circuit (IC) technologies are trending toward higher speeds and densities. The total capacitive load associated with the internal circuitry has been increasing for several generations of very large scale integration (VLSI) circuits. As the operating frequencies increase, the average on-chip current required to charge and discharge these capacitances also increases, while the switching time decreases. As a result, a large change in the total on-chip current occurs within a brief period of time.

Due to the large slew rates of the currents flowing through the bonding wires, package pins, and on-chip interconnects, the ground and supply voltage can fluctuate (or bounce) due to the parasitic impedances associated with the package-to-chip and on-chip interconnects. These voltage fluctuations on the supply and ground rails, called ground bounce, ΔI noise, or simultaneous switching noise (SSN), are further increased since a large number of the input/output (I/O) drivers and internal logic circuitry switch close in time to the clock edges. SSN generates glitches on the ground and power supply wires, decreasing the effective current drive of the circuits, producing output signal distortion, thereby reducing the noise margins of a system. As a result, the performance and functionality of the system can be severely compromised.

FIG. 1 shows an equivalent circuit 100 of an SoC (system on chip)-based power delivery system. The power distribution network is modeled as a series resistance and inductance. Superscripts p and c denote the parasitic resistance and inductance of the package and on-chip power delivery systems, respectively. The subscript $V_{dd}$ denotes the power supply voltage, and the superscript Gnd denotes ground.

Traditionally, in an SoC such as the SoC 102 of FIG. 1, noisy digital circuits 104 share the power supply voltage and the ground with noise sensitive analog circuits 106. If a number of digital blocks switch simultaneously, the current $I_D$ drawn from the power distribution network can be significant. This large current passes through the parasitic resistance $R_{Gnd}^p$ and inductance $L_{Gnd}^p$ of the package, producing voltage fluctuations on the ground terminal (point A). As a result, ground bounce (or voltage fluctuations) appears at the ground terminal of the noise sensitive circuits.

In the past, research on SSN has concentrated on transient power noise caused by current flowing through the inductive bonding wires at the I/O buffers. However, SSN originating from the internal circuitry has become an important issue in the design of very deep submicrometer (VDSM) high performance ICs, such as systems-on-chip (SoC), mixed-signal circuits, and microprocessors. This increased importance is due to fast clock rates, large on-chip switching activities and currents, and increased on-chip inductance, all of which are increasingly common characteristics of VDSM synchronous ICs.

Most of the work in this area falls into one of two categories. The first category includes analytic models that predict the behavior of the SSN, while the second category describes techniques to reduce ground bounce. A number of techniques have been proposed to reduce SSN. In one, a voltage controlled output buffer is described to control the slew rate. Ground bounce reduction is achieved by lowering the inductance in the power and ground (P/G) paths by utilizing substrate conduction. Other techniques include an algorithm based on integer linear programming to skew the switching of the drivers to minimize ground bounce, an architectural approach for reducing inductive noise caused by clock gating through gradual activation/deactivation units, and a routing method to distribute the ground bounce among the pads under a constraint of constant routing area.

The total P/G noise of the system, however, is not reduced. Decoupling capacitors are often added to maintain the voltage on the P/G rails within specification, providing charge for the switching transients. Recently, the reduction of ground bounce by bounce pre-generator circuits and supply current shaping and clock frequency modulation has been reported.

SUMMARY OF THE INVENTION

It is therefore an object of the invention to reduce noise in such circuits.

It is another object of the invention to reduce P/G noise.

It is still another object of the invention to reduce ground bounce.

To achieve the above and other objects, the present invention is directed to a circuit having an on-chip noise-free ground which is added to divert ground noise from the sensitive nodes. An on-chip decoupling capacitor, tuned in resonance with the parasitic inductance of the interconnects, can be provided to add an additional low impedance ground path. The noise reduction is shown to depend linearly on the physical separation between the noisy and noise sensitive blocks.

The present invention exhibits a strong tolerance to capacitance variations. The efficiency of the noise reduction technique drops by several percent for a ±10% variation in the magnitude of the decoupling capacitor. The present invention is shown to be effective for both single frequency and random voltage fluctuations on the ground terminal.

The present invention provides a way to reduce ground bounce in SoC and mixed-signal ICs. An additional on-chip ground is provided to divert ground noise from the sensitive analog circuits. The decoupling capacitor noted above makes the technique frequency dependent. The reduction in ground bounce is, however, almost independent of capacitance variations. Noise reductions of 68% and 22% are demonstrated for a single frequency and random ground noise, respectively. The noise reduction efficiency can be further enhanced by simultaneously lowering the impedance of the additional noise-free ground and increasing the impedance of the ground path between the digital (noisy) and analog (noise sensitive) circuits.

The following publication describes the invention and is hereby incorporated by reference: M. Popovich, E. G. Friedman, R. Secareanu, and O. L. Hartin, "On-Chip Power Noise Reduction Techniques in High Performance SoC-Based Integrated Circuits," *Proceedings of the IEEE International SOC Conference*, pp. 309-312, September 2005.

BRIEF DESCRIPTION OF THE DRAWINGS

A preferred embodiment of the invention will be presented in detail with reference to the drawings, in which.

DETAILED DESCRIPTION OF THE PREFERRED EMBODIMENT

Figure 1:
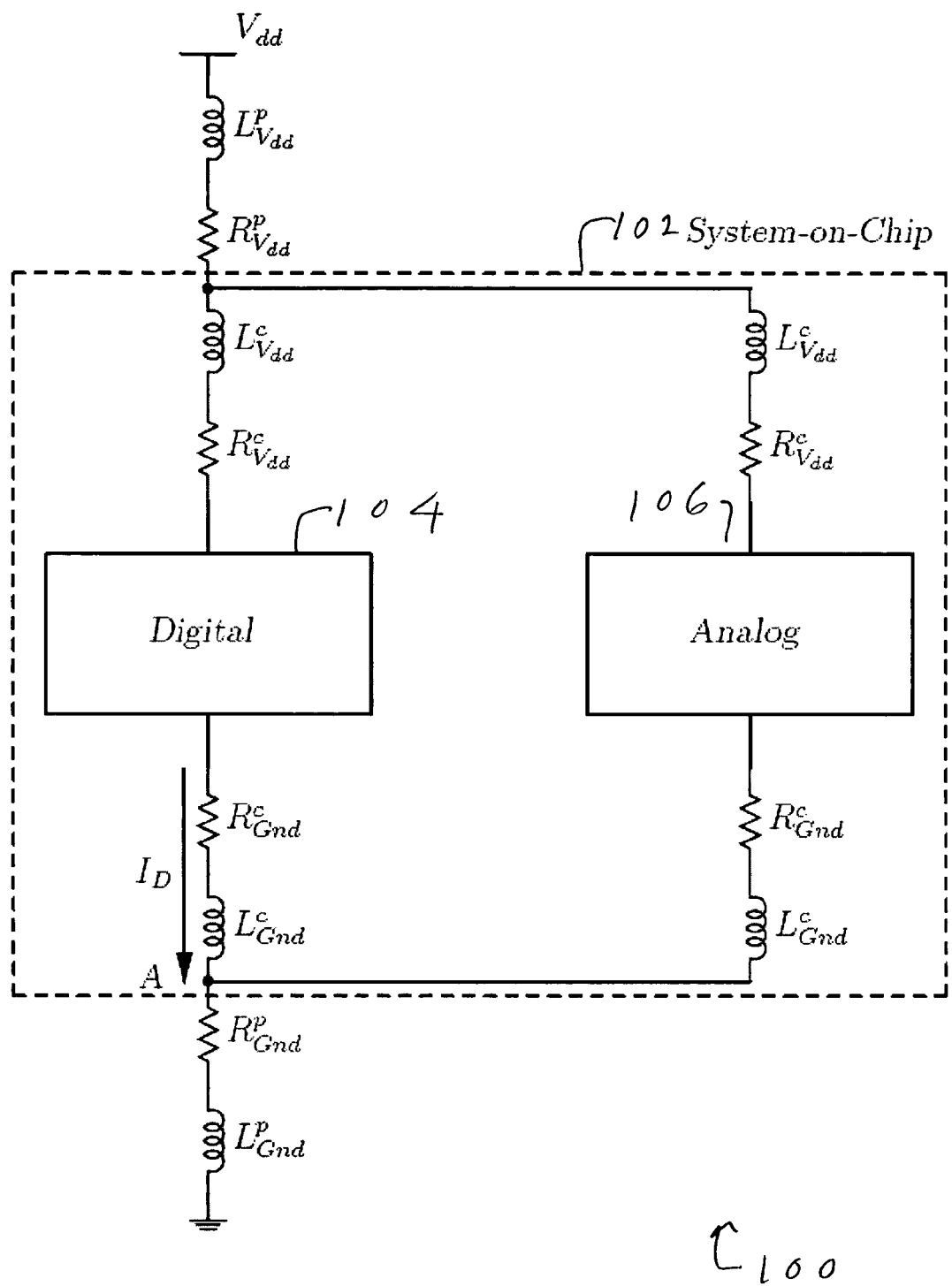
FIG. 1 is a circuit diagram showing an equivalent circuit for a conventional SoC.

A preferred embodiment will be set forth in detail with reference to the drawings, in which like reference numerals refer to like embodiments throughout.

Figure 2:
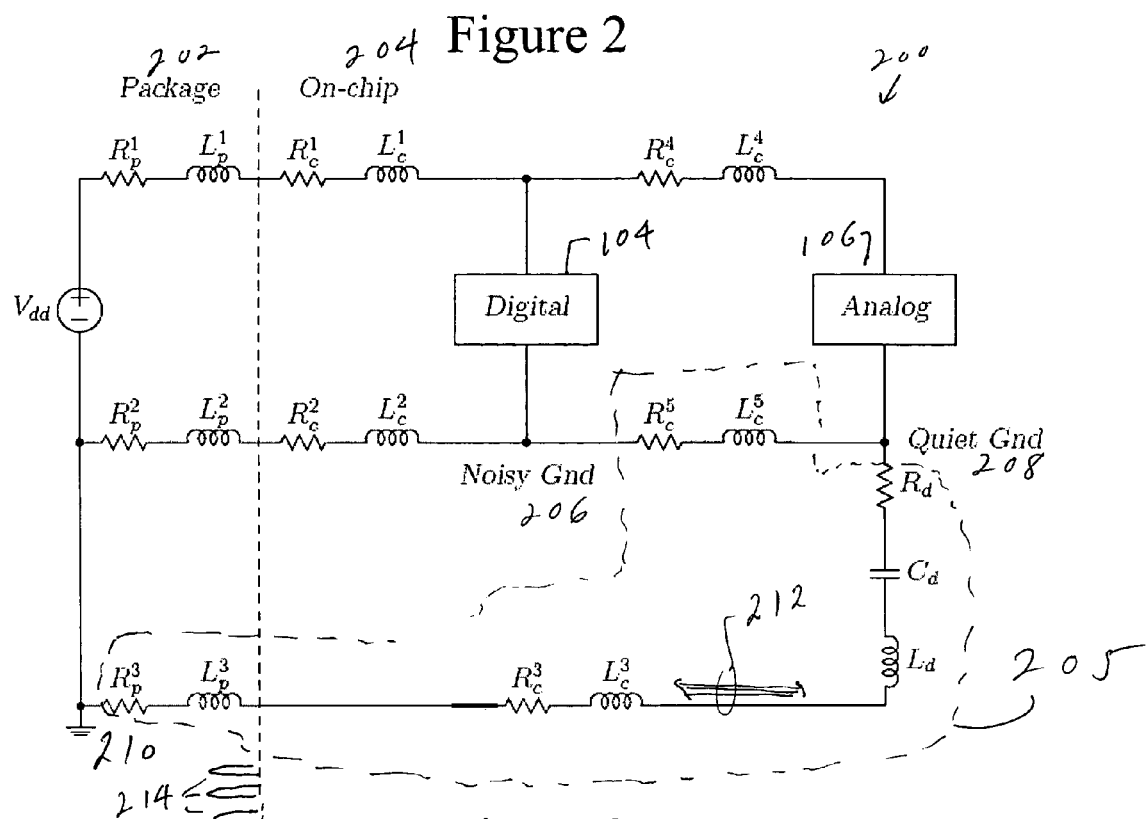
FIG. 2 is a circuit diagram showing a ground bounce reduction technique according to the preferred embodiment.

To reduce voltage fluctuations at the ground terminal of the noise sensitive blocks, an on-chip low noise ground is added, as shown in FIG. 2. The equivalent circuit 200 of FIG. 2 is shown as divided into package circuits 202 and on-chip circuits 204. The present approach is based on a voltage divider 205 formed by the impedance between the noisy ground terminal 206 and the quiet ground terminal 208 and the impedance of the path from the quiet ground terminal 208 to the off-chip ground 210. The voltage divider 205 protects the noise-sensitive analog circuitry 106 from the noisy digital circuitry 104.

An effective series resistance (ESR) and effective series inductance (ESL) of a decoupling capacitor $C_d$ are modeled by $R_d$ and $L_d$, respectively. $R_c^5$ and $L_c^5$ represent the physical separation between the noisy and noise sensitive blocks. The impedance of an on-chip additional ground is modeled by $R_c^3$ and $L_c^3$, respectively.

The value of the capacitor is chosen to cancel the parasitic inductance of the additional low noise ground, i.e., the ESL of the capacitor $L_d$ and the on-chip and package parasitic inductances of the dedicated low noise ground $L_c^3$ and $L_p^3$, respectively. Alternatively, the capacitor is tuned in resonance with the parasitic inductances at a frequency that produces the greatest noise reduction efficiency. The impedance of the additional ground path, therefore, becomes purely resistive and reaches a minimum.

The same technique can be used to reduce voltage fluctuations on the power supply. Based on the nature of the power supply noise, an additional ground path or power supply path can be provided. For instance, in the case of a voltage drop below the power supply level, an on-chip path to the power supply should be added. In the case of an overshoot, an additional ground path should be provided.

Figure 3:
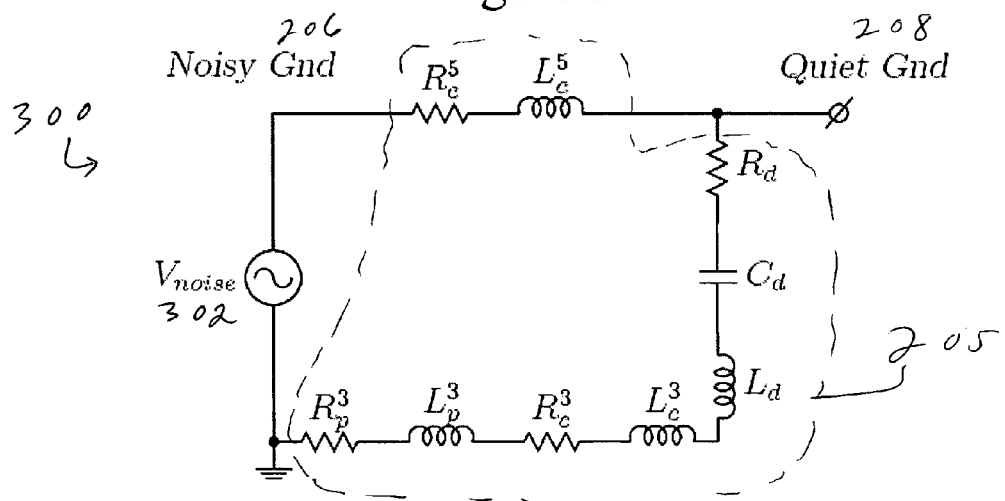
FIG. 3 is a circuit diagram showing a simplified circuit of the preferred embodiment.

To determine the efficiency of the ground bounce reduction, a simplified circuit 300 of the preferred embodiment is used, as shown in FIG. 3. Ground bounce due to simultaneously switching the digital circuits is modeled by a voltage source 302 of voltage $V_{noise}$. The Noisy Gnd 206 denotes an on-chip ground for the simultaneously switching digital circuits. The Quiet Gnd 208 denotes a noise-free ground for the noise sensitive circuits. In the simplified circuit 300 of FIG. 3, the voltage divider 205 separates the quiet ground 208 from the voltage source 302 and the noisy ground 206.

The ground bounce caused by simultaneously switching within the digital circuitry is modeled as a voltage source 302. A sinusoidal voltage source with an amplitude of 100 mV is used to determine the reduction in ground bounce at a single frequency. A triangular voltage source with an amplitude of 100 mV and 50 ps rise and 200 ps fall times is utilized to model the reduction in ground noise.

To determine the dependence of the noise reduction technique on the physical separation between the noise source and noise receiver, the impedance of the ground path between the noisy and quiet terminals is modeled as a series RL. Given the parasitic resistance and inductance per unit length, the RL impedance is varied for different unit lengths. The peak voltage at the quiet ground is evaluated using SPICE, where the distance between the digital and analog circuits is varied from one to ten unit lengths. The reduction in ground bounce as seen from the ground terminal of the noise sensitive circuit for sinusoidal and triangular noise sources is listed in Table I.

TABLE I

Ground bounce reduction as a function of separation between the noisy and noise sensitive circuits

| $R_c^5$ (mΩ) | $L_c^5$ (fH) | $V_{quiet}$ (mV) | | Noise Reduction (%) | |
|---|---|---|---|---|---|
| | | Sinusoidal | Triangular | Sinusoidal | Triangular |
| 13 | 7 | 90.81 | 97.11 | 9.2 | 2.9 |
| 26 | 14 | 82.99 | 94.68 | 17.0 | 5.3 |
| 39 | 21 | 76.30 | 92.63 | 23.7 | 7.4 |
| 52 | 28 | 70.54 | 90.55 | 29.5 | 9.5 |
| 65 | 35 | 65.53 | 89.36 | 34.5 | 10.6 |
| 78 | 42 | 61.16 | 88.06 | 38.8 | 11.9 |
| 91 | 49 | 57.33 | 86.93 | 42.7 | 13.1 |
| 104 | 56 | 53.94 | 85.93 | 46.1 | 14.1 |
| 117 | 63 | 50.91 | 85.05 | 49.1 | 15.0 |
| 130 | 70 | 48.23 | 84.28 | 51.8 | 15.7 |

$V_{noise} = 100$ mV, f = 1 GHz, $R_p^3 = 10$ mΩ
$L_p^3 = 100$ pH, $R_c^3 = 100$ mΩ, $L_c^3 = 100$ fH, $R_d = 10$ mΩ
$L_d = 10$ fH, $C_d^{Sin} = 253$ pF, $C_d^{Triang} = 63$ pF Note that the reduction in ground noise increases linearly as the physical separation between the noisy and noise sensitive circuits becomes greater. A reduction in ground bounce of about 52% for a single frequency noise source and about 16% for a random noise source is achieved for the ground line (of ten unit lengths) between the digital and analog blocks. Enhanced results can be achieved if the impedance of the additional ground is much smaller than the impedance of the interconnect between the noisy and noise sensitive modules. From a circuits perspective, the digital and analog circuits should be placed far from each other, and the additional low noise ground should be composed of many parallel lines. Moreover, the additional ground should be placed close to the multiple ground pins.

Note that since the preferred embodiment utilizes a capacitor tuned in resonance with the parasitic inductance of an additional ground path, this approach is frequency dependent and produces the best results for a single frequency noise source. In the case of a random noise source, the frequency harmonic with the highest magnitude will be significantly lower in magnitude, thereby achieving the greatest reduction in noise. For example, based on a discrete Fourier transform (DFT), the second harmonic is selected in the case of a triangular noise source.

To determine the sensitivity of the ground bounce reduction technique on frequency and capacitance variations, the frequency is varied by ±50% from the resonant frequency and the capacitor is varied by +10% from the target value. The range of capacitance variation is chosen based on typical process variations for a CMOS technology.

Figure 4:
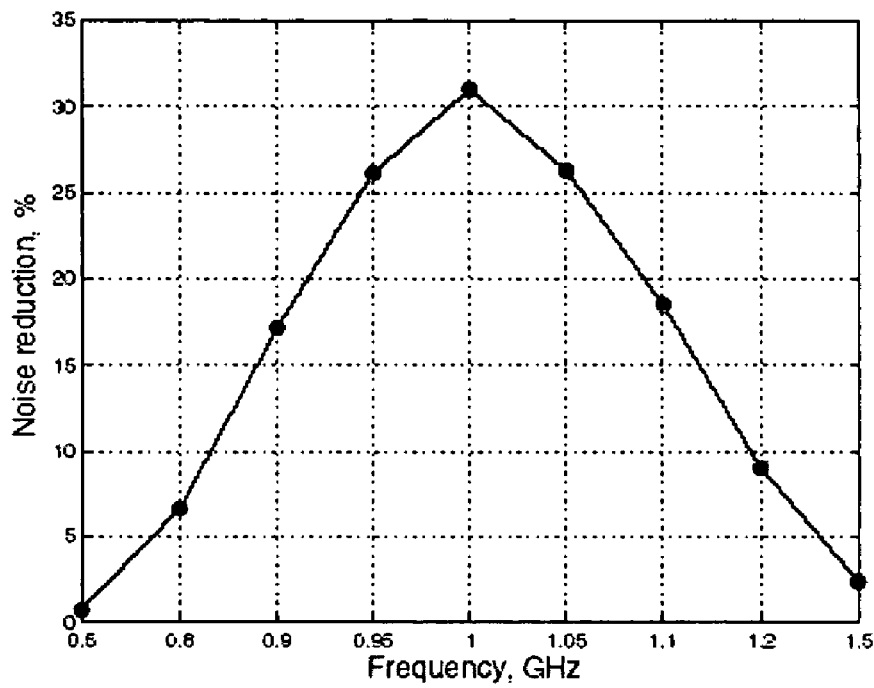
FIG. 4 is a graph of ground bounce reduction as a function of frequency.
Figure 5:
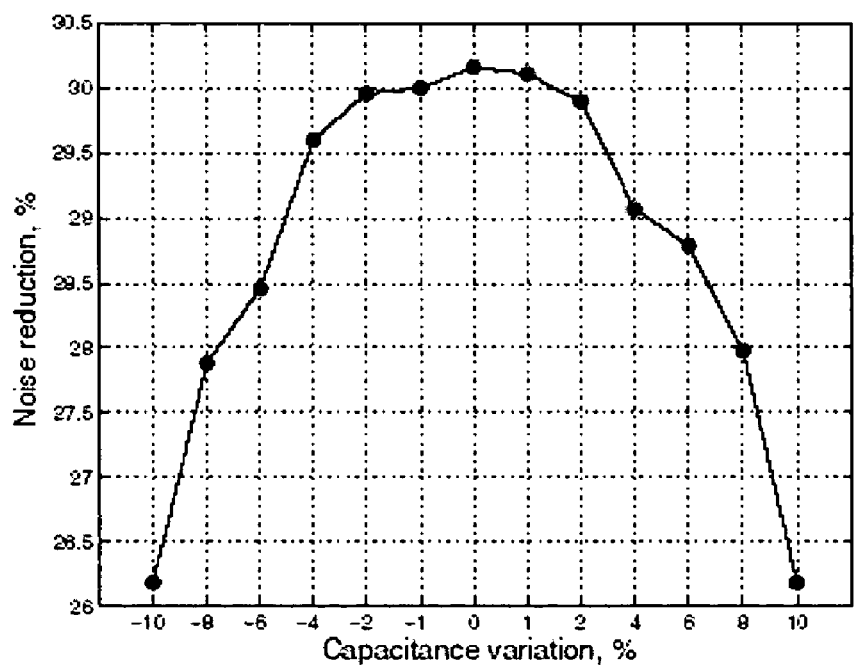
FIG. 5 is a graph of ground bounce reduction as a function of capacitance variations.

The efficiency of the reduction in ground bounce for a sinusoidal noise source versus frequency and capacitance variations is illustrated in FIGS. 4 and 5, respectively. FIG. 4 shows ground bounce reduction as a function of noise frequency. The ground noise is modeled as a sinusoidal voltage source. FIG. 5 shows the efficiency of the reduction in ground bounce as a function of capacitance variations. The ground bounce is modeled as a sinusoidal voltage source.

Note that the noise reduction drops linearly as the noise frequency varies from the target resonant frequency. The noise reduction is slightly greater for higher frequencies. This phenomenon is due to an uncompensated parasitic inductance of the ground connecting the digital circuits to the analog circuits. As a result, at higher frequencies, the impedance of the ground path of a power delivery network increases, enhancing the noise reduction efficiency. In general, the preferred embodiment results in greater noise reduction efficiency at higher frequencies. As illustrated in FIG. 5, the reduction in ground bounce is almost insensitive to capacitance variations. The efficiency of the preferred embodiment drops by about 4% as the capacitance is varied by ±10%.

As described above, the preferred embodiment for reducing ground bounce utilizes a voltage divider formed by the ground of an on-chip power distribution system and an additional low noise ground. To increase the efficiency of the preferred embodiment, the voltage transfer function of the voltage divider should be lowered, permitting a greater portion of the noise voltage to be diverted from the die through the additional ground. Placing noisy and noise sensitive blocks distant from each other lowers the ground bounce at the ground terminal of the analog circuits. The ground noise can also be reduced by lowering the impedance of the low noise ground. The parasitic inductance of the additional ground is canceled by the capacitor tuned in resonance to the specific frequency. The impedance of the additional ground is therefore purely resistive at the resonant frequency. The noise reduction efficiency for different values of the parasitic resistance of the low noise ground is listed in Table II.

TABLE II

Ground bounce reduction for different values of parasitic resistance of the on-chip low noise ground

| | $V_{quiet}$ (mV) | | Noise Reduction (%) | |
| --- | --- | --- | --- | --- |
| R3 c (mΩ) | Sinusoidal | Triangular | Sinusoidal | Triangular |
| 100 | 60.54 | 87.88 | 39.5 | 12.1 |
| 80 | 56.52 | 86.57 | 43.5 | 13.4 |
| 60 | 51.67 | 84.98 | 48.3 | 15.0 |
| 40 | 45.79 | 83.03 | 54.2 | 17.0 |
| 20 | 38.59 | 80.60 | 61.4 | 19.4 |
| 10 | 34.37 | 79.15 | 65.6 | 20.9 |
| 5 | 32.08 | 78.37 | 67.9 | 21.6 |

$V_{noise} = 100$ mV, $f = 1$ GHz, $R_p^3 = 10$ mΩ, $L_p^3 = 100$ pH
$L_c^3 = 100$ fH, $R_c^5 = 80$ mΩ, $L_c^t = 40$ fH, $R_d = 10$ mΩ
$L_d = 10$ fH, $C_d^{Sin} = 253$ pF, $C_d^{Triang} = 63$ pF Note from Table II that by reducing the parasitic resistance of an on-chip low noise ground, the ground bounce can be significantly lowered. Noise reductions of about 68% and 22% are demonstrated for sinusoidal and triangular noise sources, respectively. The results listed in Table II are determined for an average resistance and inductance of the on-chip power distribution ground of five unit lengths (see Table I). Thus, the ground bounce can be further reduced if the analog and digital circuits are placed at a greater distance from each other. Even better results can be achieved if the parasitic resistance of the package pins $R_p^3$ and decoupling capacitor $R_d$ are lowered. From a circuits perspective, the on-chip low noise ground should be composed of many narrow lines connected in parallel (212 in FIG. 2) to lower the parasitic resistance and inductance. A number of package pins (214 in FIG. 2) should be dedicated to the noise-free ground to lower the package resistance. Finally, a decoupling capacitor with a low parasitic resistance (ESR) should be used.

While a preferred embodiment of the present invention has been set forth in detail above, those skilled in the art who have reviewed the present disclosure will readily appreciate that other embodiments can be realized within the scope of the invention. For example, numerical values are illustrative rather than limiting. Therefore, the present invention should be construed as limited only by the appended claims.

We claim:

1. An electronic circuit comprising:
   a noisy circuit component;
   a noise-sensitive circuit component;
   a power supply for supplying power to the noisy circuit component and the noise-sensitive circuit component;
   an external ground;
   a noisy ground for grounding the noisy circuit component to the external ground;
   a quiet ground for grounding the noise-sensitive circuit component to the external ground; and
   a voltage divider for connecting the to the noise ground, the quiet ground and at least one of the power supply and the external ground while shielding the noise-sensitive circuit component from noise from the noisy circuit component.

2. The circuit of claim 1, wherein the voltage divider connects the noise-sensitive circuit component to the external ground via the quiet ground while shielding the noise-sensitive circuit component from the noise from the noisy circuit component by being connected between the quiet ground and the noisy ground.

3. The circuit of claim 2, wherein the voltage divider comprises a decoupling capacitor connected between the quiet ground and the external ground.

4. The circuit of claim 3, wherein the voltage divider has a parasitic inductance between the quiet ground and the external ground, and wherein the decoupling capacitor has a value selected to cancel the parasitic inductance.

5. The circuit of claim 3, wherein the voltage divider has a parasitic inductance between the quiet ground and the external ground, and wherein the decoupling capacitor has a value which is tuned in resonance with the parasitic inductance at a frequency which maximizes noise reduction efficiency.

6. The circuit of claim 2, wherein the circuit is a system-on-chip circuit, and wherein the circuit further comprises a package containing the noisy circuit component, the noise-sensitive circuit component, the noisy ground, the quiet ground and the voltage divider.

7. The circuit of claim 6, wherein the external ground comprises at least one pin extending from the package.

8. The circuit of claim 7, wherein the voltage divider comprises a decoupling capacitor connected between the quiet ground and the external ground.

9. The circuit of claim 8, wherein the voltage divider has a parasitic inductance between the quiet ground and the external ground, and wherein the decoupling capacitor has a value selected to cancel the parasitic inductance.

10. The circuit of claim 8, wherein the voltage divider has a parasitic inductance between the quiet ground and the external ground, and wherein the decoupling capacitor has a value which is tuned in resonance with the parasitic inductance at a frequency which maximizes noise reduction efficiency.

11. The circuit of claim 7, wherein the external ground comprises a plurality of said pins.

12. The circuit of claim 6, wherein the quiet ground comprises a plurality of lines in parallel.

13. The circuit of claim 1, wherein the noisy circuit component comprises a digital circuit component, and wherein the noise-sensitive circuit component comprises an analog circuit component.

14. A method for designing and producing an electronic circuit, wherein the circuit comprises a noisy circuit component, a noise-sensitive circuit component, a power supply for supplying power to the noisy circuit component and the noise-sensitive circuit component, an external ground, a noisy ground for grounding the noisy circuit component to the external ground, and a quiet ground for grounding the noise-sensitive circuit component to the external ground, the method comprising the step of:
   (a) providing a voltage divider comprising a decoupling capacitor;
   (b) connecting the voltage divider between to the quiet ground, the noisy ground and at least one of the power supply and the external ground while shielding the noise-sensitive circuit component from noise from the noisy circuit component; and
   (c) selecting a value of the decoupling capacitor for shielding the quiet ground from noise from the noisy ground.

15. The method of claim 14, wherein the voltage divider is further provided for connecting the quiet ground to the external ground.

16. The method of claim 15, wherein the voltage divider further has a parasitic inductance between the quiet ground and the external ground, and wherein step (c) comprises selecting the value of the decoupling capacitor to cancel the parasitic inductance.

17. The method of claim 15, wherein the voltage divider has a parasitic inductance between the quiet ground and the external ground, and wherein step (c) comprises selecting the value of the decoupling capacitor to be tuned in resonance with the parasitic inductance at a frequency which maximizes noise reduction efficiency.

18. The method of claim 17, wherein the noise is at a single frequency, and wherein step (c) comprises selecting the value of the decoupling capacitor in accordance with the single frequency.

19. The method of claim 17, wherein the noise is at a plurality of frequencies, and wherein step (c) comprises selecting the value of the decoupling capacitor in accordance with one of the plurality of frequencies.

20. The method of claim 19, wherein said one of the plurality of frequencies is a frequency harmonic with a highest magnitude.

21. The method of claim 20, wherein the frequency harmonic with the highest magnitude is a second harmonic.

22. The method of claim 14, wherein the circuit is a system-on-chip circuit.

23. The method of claim 14, wherein the noisy circuit component comprises a digital circuit component, and wherein the noise-sensitive circuit component comprises an analog circuit component.

* * * * *

UNITED STATES PATENT AND TRADEMARK OFFICE
CERTIFICATE OF CORRECTION

PATENT NO. : 7,595,679 B1  Page 1 of 1
APPLICATION NO. : 11/402252
DATED : September 29, 2009
INVENTOR(S) : Popovich et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 525 days.

Signed and Sealed this

Twenty-eighth Day of September, 2010

David J. Kappos
*Director of the United States Patent and Trademark Office*